United States Patent
Noh et al.

(10) Patent No.: US 7,322,721 B2
(45) Date of Patent: Jan. 29, 2008

(54) SIDE EMITTING DEVICE, BACKLIGHT UNIT USING THE SAME AS LIGHT SOURCE AND LIQUID CRYSTAL DISPLAY EMPLOYING THE BACKLIGHT UNIT

(75) Inventors: Ji-whan Noh, Suwon-si (KR); Joon-chan Park, Anyang-si (KR); Dong-ha Kim, Suwon-si (KR); Jong-min Wang, Seongnam-si (KR); Ju-seong Hwang, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 112 days.

(21) Appl. No.: 11/233,006

(22) Filed: Sep. 23, 2005

(65) Prior Publication Data

US 2006/0067079 A1   Mar. 30, 2006

(30) Foreign Application Priority Data

Sep. 25, 2004   (KR) .................. 10-2004-0077595

(51) Int. Cl.
*F21V 5/00* (2006.01)

(52) U.S. Cl. .................. 362/327; 362/336; 362/623

(58) Field of Classification Search .................. None
See application file for complete search history.

(56) References Cited

U.S. PATENT DOCUMENTS 6,598,998 B2 * 7/2003 West et al. .................. 362/307
6,679,621 B2 * 1/2004 West et al. .................. 362/327
6,997,571 B2 * 2/2006 Tenmyo ....................... 362/16
2005/0001537 A1 * 1/2005 West et al. .................. 313/500

FOREIGN PATENT DOCUMENTS

| JP | 2000-299500 | 10/2000 |
|----|-------------|---------|
| JP | 2003-158302 | 5/2003  |
| JP | 2003-258319 | 9/2003  |

\* cited by examiner

*Primary Examiner*—Sharon E. Payne
*Assistant Examiner*—Kristen A Manskar
(74) *Attorney, Agent, or Firm*—Stanzione & Kim, LLP

(57) ABSTRACT

A side emitting device, a backlight unit using the same as a light source, and a liquid crystal display (LCD) employing the backlight unit. The side emitting device includes a light-emitting device to emit light, and a side emitter to change the path of at least part of the light emitted from the light-emitting device. The side emitter includes a first reflecting surface reflecting light emitted from the light-emitting device in a first range of angles close to a central axis, a first refracting surface refracting the light reflected by the first reflecting surface obliquely downward from the horizontal axis, and a second refracting surface refracting light emitted from the light-emitting device in a second range of angles complementary to the first range of angles. The backlight unit includes at least an array of side emitting devices, a reflection diffusion plate and a first transmission diffusion plate.

52 Claims, 2 Drawing Sheets

SIDE EMITTING DEVICE, BACKLIGHT UNIT USING THE SAME AS LIGHT SOURCE AND LIQUID CRYSTAL DISPLAY EMPLOYING THE BACKLIGHT UNIT

CROSS-REFERENCE TO RELATED APPLICATIONS

This application claims the benefit of priority under U.S.C. § 119 from Korean Patent Application No. 2004-77595, filed on Sep. 25, 2004, in the Korean Intellectual Property Office, the disclosure of which is incorporated herein in its entirety by reference.

BACKGROUND OF THE INVENTION

1. Field of the Invention

The present general inventive concept relates to a side emitting device, a backlight unit using the same as a light source, and an image display apparatus employing the backlight unit.

2. Description of the Related Art

Liquid crystal displays (LCDs), a type of flat panel display, are light receiving displays in which an image is produced not by self-emission but by external light. The LCDs need external light sources to display images since the LCDs themselves do not directly emit light. When using LCDs, backlight units are installed at a rear side of the LCDs to illuminate the LCDs.

The backlight units are mainly classified according to the arrangement of the light sources into a direct light type, in which a plurality of light sources are installed behind an LCD to directly emit light onto a liquid crystal panel, and an edge-light type, in which a light source is installed at a sidewall of a light guide panel (LGP) propagating light toward a liquid crystal panel.

The direct light type backlight units may use a light emitting diode (LED) that emits a Lambertian light as a point light source. When the light emitted from the LED is diffused by a diffusion plate and then directed onto a liquid crystal panel, in order to make color light emitted from the LED not noticeable over the diffusion plate, a side emitting LED that can change the direction of the light from the LED in a side direction, such that the light is incident onto the diffusion plate is required.

U.S. Pat. No. 6,679,621 discloses a side emitting LED. The conventional side emitting LED of U.S. Pat. No. 6,679,621 includes a funnel-shaped reflecting surface obliquely angled with respect to a central axis, a first refracting surface obliquely angled with respect to the central axis and refracting light reflected by the reflecting surface, and a convex or sawtooth-shaped second refracting surface extending from a bottom surface to the first refracting surface.

Light emitted from the light source and directly incident on the funnel-shaped reflecting surface is then reflected by the reflecting surface to the first refracting surface, where it is then refracted thereby by the first refracting surface to propagate substantially sideways. Light emitted from the light source and directly incident on the convex second refracting surface is refracted by the second refracting surface to propagate substantially sideways.

Since the conventional side emitting LED emits light sideways, when the conventional side emitting LEDs are arranged in an array, adjacent LEDs may interfere with each other. Accordingly, the conventional side emitting LED is not suitable for backlight units.

SUMMARY OF THE INVENTION

The present general inventive concept provides a side emitting device which enables light to be uniformly mixed when the side emitting devices are used by a backlight unit and interference between adjacent sources does not occur, a backlight unit using the side emitting devices as light sources, and an image display apparatus employing the backlight unit.

Additional aspects and advantages of the present general inventive concept will be set forth in part in the description which follows and, in part, will be obvious from the description, or may be learned by practice of the general inventive concept.

The foregoing and/or other aspects of the present general inventive concept are achieved by providing a side emitting device including a light-emitting device to emit light and a side emitter to change the path of at least a part of the light emitted from the light-emitting device, wherein when a main direction of the light emitted from the light-emitting device is an upward direction, a direction opposite to the upward direction is a downward direction, and an axis perpendicular to the main direction is a horizontal axis. The side emitter is disposed above the light-emitting device and includes a first reflecting surface to reflect the light emitted from the light-emitting device in a first range of angles close to a central axis thereof, a first refracting surface to refract the light reflected by the first reflecting surface obliquely downward with respect to the horizontal axis, and a second refracting surface to refract the light emitted from the light-emitting device in a second range of angles complementary to the first range of angles.

The first reflecting surface may be a total-internal-reflection surface that reflects at least a part of the light emitted in the first range of angles by a total internal reflection.

The first reflecting surface may be a cone-shaped surface centered about the central axis, and may be one of a flat shape and a concave shape.

The first range of angles may range from approximately 40° to 140° with respect to the horizontal axis of the light-emitting device.

The first refracting surface may be slanted away and downward from the first reflecting surface with respect to an axis parallel to the central axis.

The first refracting surface may slant away at an angle of approximately 30° to 60° with respect to the axis parallel to the central axis.

The second refracting surface may refract at least a part of the incident light obliquely downward from the horizontal axis.

The second refracting surface may be one of a flat surface and a concave surface.

The side emitting device may further include a second reflecting surface to reflect the light refracted by the second refracting surface obliquely downward.

The second reflecting surface may be in contact with the first refracting surface and the second refracting surface, and may be a coated surface to reflect incident light.

Each of the first refracting surface, the second refracting surface, and the first reflecting surface may be symmetric about the central axis.

The foregoing and other aspects of the present general inventive concept may also be achieved by providing a backlight unit including an array of the side emitting devices as described above, arranged on a base plate, a reflection diffusion plate disposed under the side emitting devices to diffuse and reflect the light incident from the side emitting device, and a first transmission diffusion plate disposed above the side emitting devices to diffuse and transmit the incident light.

Each of the side emitting devices may emit one of red, green, and blue light, or may emit white light.

The backlight unit may further include an optical plate disposed above the side emitting devices, and a plurality of reflective mirrors formed on one surface of the optical plate to reflect light that passes through the side emitting devices and propagates upwardly.

The optical plate may be one of a plate made of a transparent polymethyl-methacrylate (PMMA) and a second transmission diffusion plate.

The backlight unit may further comprise at least one of a brightness enhancement film to enhance directionality of the light emitted from the first transmission diffusion plate and a polarization enhancement film to enhance polarization efficiency.

The foregoing and other aspects of the present general inventive concept may also be achieved by providing a liquid crystal display comprising a liquid crystal panel and the backlight unit described above illuminating the liquid crystal panel.

The foregoing and other aspects of the present general inventive concept may also be achieved by providing an illumination controlling apparatus including a base portion that contacts a light-emitting device to receive the emitted light therefrom, a first cone-shaped reflecting surface to reflect the light received within a first range of angles with respect to a central axis thereof, a first refracting surface to refract the light reflected by the first reflecting surface obliquely and back toward the light emitting device, and a second refracting surface to refract the light received within a second range of angles complementary to the first range of angles with respect to a central axis thereof.

The foregoing and other aspects of the present general inventive concept may also be achieved by providing a method of redirecting light emitted by a Lambertian light source mounted on a base surface wherein when a central axis is perpendicular to the base surface passing through the Lambertian light source, and an axis perpendicular to the central axis passing through the Lambertian light source is a horizontal axis, the method including changing the path of at least a part of the light from the Lambertian light source emitted in a first range of angles close to a central axis, refracting the light with changed path obliquely with respect to the horizontal axis towards the Lambertian light source, and refracting a first portion of the light from the Lambertian light source emitted in a second range of angles complementary to the first range of angles obliquely with respect to the horizontal axis towards the Lambertian light source

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
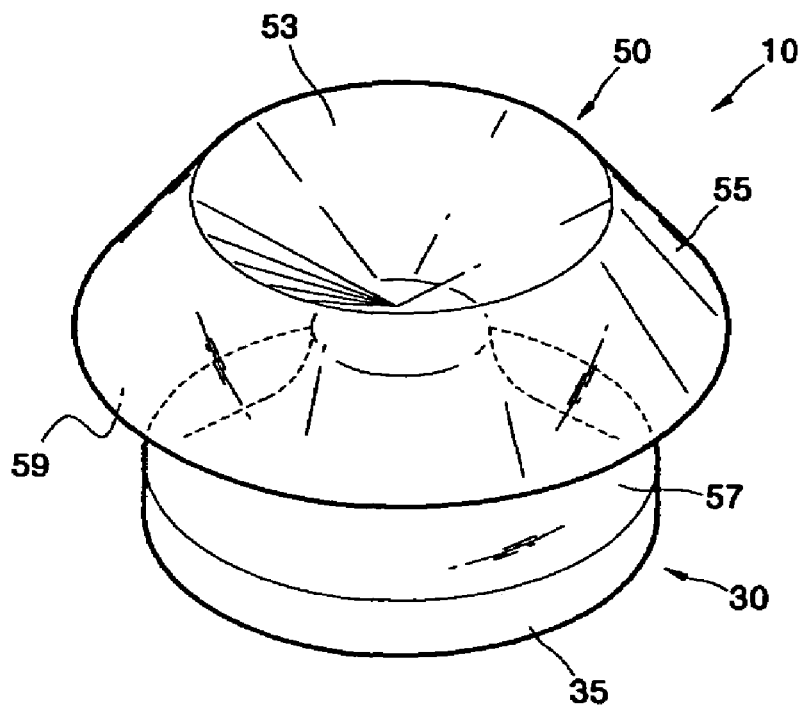
FIG. 1 is a schematic perspective view of a side emitting device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 2:
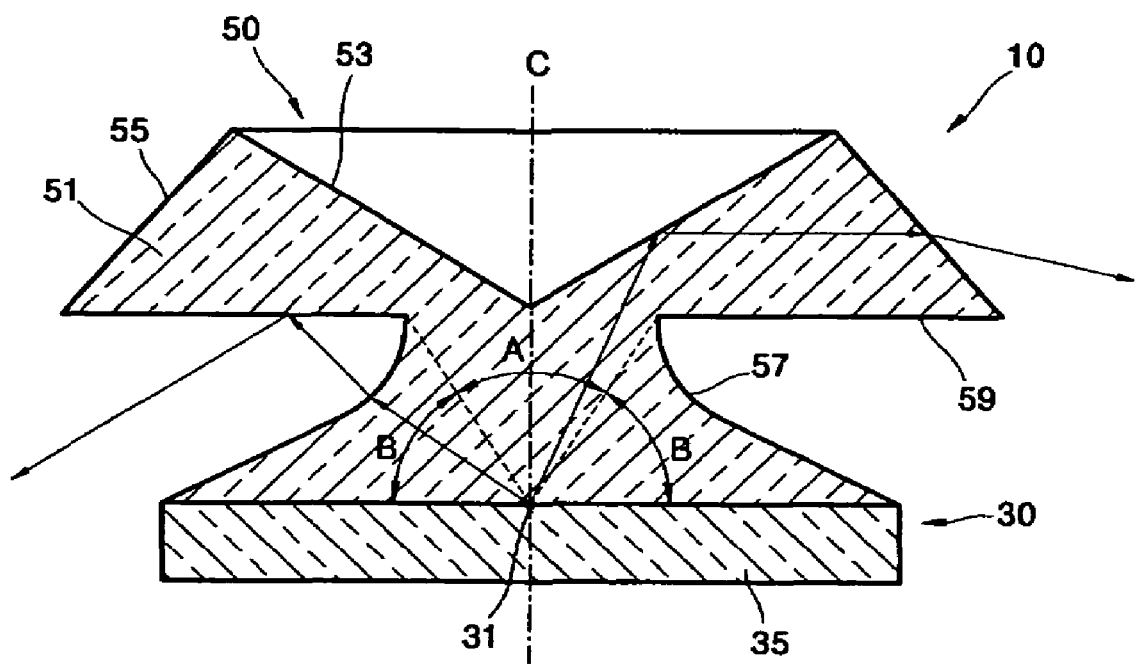
FIG. 2 is a side view of the side emitting device illustrated in FIG. 1.

FIG. 1 is a schematic perspective view of a side emitting device 10 according to an embodiment of the present general inventive concept. FIG. 2 is a side view of the side emitting device illustrated in FIG. 1.

Referring to FIGS. 1 and 2, the side emitting device 10 includes a light-emitting device 30, and a side emitter 50 directing light incident from the light-emitting device 30 obliquely downward.

Here, when a main direction of the light emitted from the light-emitting device 30 is referred to as an upward direction, a downward will be referred to as a direction opposite to the upward direction. Here, the main direction of the light emitted from the light-emitting device 30 substantially corresponds to a central axis C of the side emitting device 10, and the upward direction corresponds to the direction of the light that is emitted from the light-emitting device 30 and propagates along the central axis C of the side emitting device 10. A horizontal axis is referred to as an axis perpendicular to the main direction, that is, perpendicular to the central axis C.

The light-emitting device 30 includes a light emitting diode (LED) chip 31 to generate light, disposed on a base 35, and the corresponding side emitter 50 to which the LED chip 31 may be coupled.

The LED chip 31 and the side emitter 50 can be in close contact with each other, so that the amount of light generated by the LED chip 31 and entering the side emitter 50 can be maximized.

The side emitter 50 has a transparent body 51 made of a transparent material. The side emitter 50 includes a first reflecting surface 53, a first refracting surface 55, a second refracting surface 57 and a second reflecting surface 59. The first reflecting surface 53 reflects the light emitted from the light-emitting device 30 within a first range A of angles close to the central axis C. The first refracting surface 55 refracts the light reflected by the first reflecting surface 53 obliquely downward. The second refracting surface 57 refracts the light emitted from the light-emitting device 30 in a second range B of angles farther from the central axis C than the first range A. The first reflecting surface 53 and the first and second refracting surfaces 55 and 57 are surfaces of the transparent body 51.

The central axis C of the side emitting device 10 according to the present embodiment is the same as the central axis of the LED chip 31 and the side emitter 50.

The first range A of angles is approximately 40 to 140°, or alternatively can be approximately 50 to 130° with respect to the horizontal axis that passes through the light emitting point of the light-emitting device 30, that is, the central point of the LED chip 31.

The first reflecting surface 53 may be a total-internal-reflection surface that totally internally reflects at least a part of the light emitted from the LED chip 31 in the first angle range A. The first reflecting surface 53 may be formed to reflect the light to propagate in a direction parallel to the horizontal axis, that is, at an angle of 0°.

The first reflecting surface 53 may be a cone-shaped surface centered about the central axis C. Furthermore, the first reflecting surface 53 may be a flat surface or a concave surface.

The first refracting surface 55 may be connected to the first reflecting surface 53. The first refracting surface 55 may be formed to refract the light totally internally reflected by the first reflecting surface 53 obliquely downward and at an angle of approximately −10° or less from the horizontal axis. The first refracting surface 55 slants away from the first reflecting surface 53 in a downward direction and away from an axis parallel to the central axis C. For example, the first refracting surface 55 may be slanted at an angle of approximately 30 to 60° with respect to the axis parallel with the central axis C.

The direction of the light refracting from the first refracting surface 55 may be changed by changing the inclination angle of the first refracting surface 55.

The second refracting surface 57 may be formed to refract the light emitted from the light-emitting device 30 at a second range B of angle.

When the first range A of angles includes 40 to 140°, the second range B of angles substantially includes approximately 0° to 40° and 140° to 180° with respect to the horizontal axis. When the first range A of angles includes 50° to 130°, the second range B of angles includes 0° to 50° and 130° to 180° with respect to the horizontal axis.

The second refracting surface 57 may be a concave surface or a flat surface. FIGS. 1 and 2 show an example where the second refracting surface 57 is a concave surface.

The second refracting surface 57 can refract at least part of incident light obliquely downward at an angle of approximately −10° or less with respect to the horizontal axis.

Since the angle of light incident on the second refracting surface 57 varies according to the position on the second refracting surface 57 on which the light is incident, some of the light may propagate obliquely upward after being refracted by the second refracting surface 57.

The side emitter 50 according to the present embodiment may further include the second reflecting surface 59 to reflect obliquely downward the light which is refracted obliquely upward by the second refracting surface 57.

The second reflecting surface 59 may be a coated surface to reflect incident light.

The second reflecting surface 59 may be formed to be parallel or almost parallel to the horizontal axis. The second reflecting surface 59 may be connected to the second refracting surface 57 at one end and to the first refracting surface 55 at another end.

Here, the second refracting surface 57 may be formed to refract most of the incident light toward the second reflecting surface 59, that is, obliquely upward. The second reflecting surface 59 may reflect the incident light to direct the light obliquely downward, and possibly at an angle of approximately −10° or less, from the horizontal axis.

Accordingly, the second refracting surface 57 and the second reflecting surface 59 may be disposed so that the light which passes through the second refracting surface 57 or passes through the surface 57 and is then reflected by the second reflecting surface 59 can propagate obliquely downward at an angle of approximately −10° from the horizontal axis.

Each of the first reflecting surface 53 and the first and second refracting surfaces 55 and 57 may be symmetric about the central axis C so that the side emitter 50 can direct the light incident from the light-emitting device 30 obliquely downward with a uniform distribution. Further, the second reflecting surface 59 may also be symmetric about the central axis C.

The side emitting device 10 constructed as described above can send most of the light downward from the horizontal axis.

Since the first reflecting surface 53 of the side emitter 50 of the side emitting device 10 is not coated to reflect the incident light and has a structure to totally internally reflect only the light satisfying total internal reflection conditions among the light incident thereon, a part of the light is transmitted through the first reflecting surface 53 and propagates upward from the side emitting device 10. Nevertheless, the side emitting device 10 can direct most of the light obliquely downward such that a substantial amount of light can reach a side lower end portion of the side emitting device 10. Accordingly, when the side emitting device 10 is used as a point light source for a backlight unit, the light can be uniformly mixed, and thus the thickness of the backlight unit can be reduced.

Also, when a plurality of the side emitting devices 10 are arranged in an array, the light incident on adjacent side emitting devices 10 can be minimized, and thus an interference with the light emitted by LED chips 31 of the adjacent side emitting devices 10 can be minimized.

Figure 3:
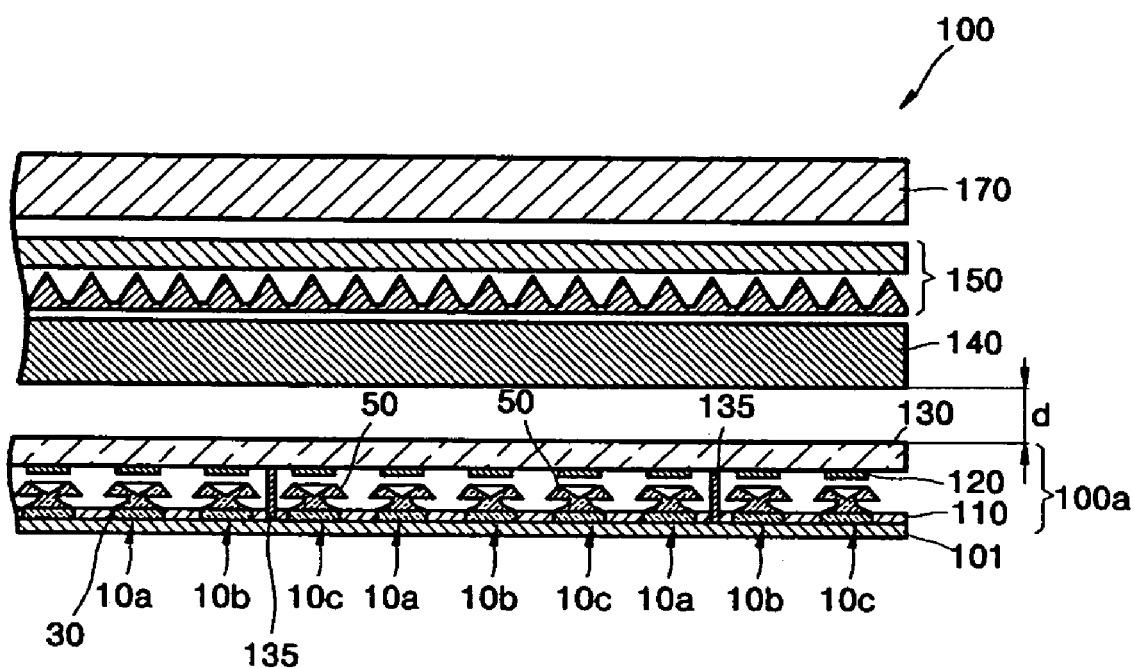
FIG. 3 is a schematic sectional view of a backlight unit including an array of the side emitting devices illustrated in FIG. 1 according to another embodiment of the present general inventive concept.

FIG. 3 is a schematic sectional view of a backlight unit 100 including an array of the side emitting devices 10 as a light source according to an embodiment of the present general inventive concept.

Referring to FIG. 3, the backlight unit 100 includes an array of side emitting devices 10a, 10b, and 10c, a base plate 101, a reflection diffusion plate 110, and a transmission diffusion plate 140. The side emitting devices 10a, 10b, and 10c are arranged on the base plate 101. The reflection diffusion plate 110 is disposed under the side emitting devices 10a, 10b, and 10c, to diffuse and reflect the light emitted from the side emitting devices 10a, 10b, and 10c. The transmission diffusion plate 140 is disposed above the side emitting devices 10a, 10b, and 10c to diffuse and transmit the incident light.

The base plate 101 acts as a substrate on which the plurality of side emitting devices 10a, 10b, and 10c are disposed in an array. The base plate 101 may be a printed circuit board (PCB) that drives the side emitting devices 10a, 10b, and 10c. The PCB that drives the side emitting devices 10a, 10b, and 10c may be manufactured separately from the base plate 101.

Each of the side emitting devices 10a, 10b, and 10c has the same structure as the side emitting device 10 described above with reference to FIGS. 1 and 2. Most of the Lambertian light emitted from the LED chip 31 disposed under the side emitter 50 of each of the side emitting devices 10a, 10b, and 10c propagates obliquely downward as a result of the side emitter 50.

The side emitting devices 10a, 10b, and 10c may emit respectively red (R), green (G), and blue (B) light. In this case, the LED chips 31 to generate R, G, and B light are respectively included in the side emitting devices 10a, 10b, and 10c.

Alternatively, all side emitting devices 10*a*, 10*b*, and 10*c* may emit white light. In this case, the LED chips 31 to generate the white light are included in each of the side emitting devices 10*a*, 10*b*, and 10*c*.

When the LED chips 31 to generate the R, G, and B light or the LEDs to generate the white light are respectively included in the side emitting devices 10*a*, 10*b*, and 10*c*, a liquid crystal display (LCD) employing the backlight unit can display a color image.

The reason why the side emitting devices 10*a*, 10*b*, and 10*c*, are labelled with different reference numerals in FIG. 3 is to differentiate the side emitting devices 10*a*, 10*b*, and 10*c* when the LEDs emit different colors of light. If all the side emitting devices emit white light, all the side emitting devices may be given reference the same numeral 10.

The reflection diffusion plate 110 diffuses and reflects upward the light propagating obliquely downward from the side emitters 50 of the side emitting devices 10*a*, 10*b*, and 10*c*.

The reflection diffusion plate 110 is disposed on the base plate 101 and under the side emitting devices 10*a*, 10*b*, and 10*c* with reference to when the base plate 110 is positioned horizontally. A plurality of holes through which the plurality of side emitting devices 10*a*, 10*b*, and 10*c* can pass may be formed in the reflection diffusion plate 110. The side emitting devices 10*a*, 10*b*, and 10*c* may be inserted into the holes of the reflection diffusion plate 110 disposed on the base plate 101.

The transmission diffusion plate 140 is disposed over the side emitting devices 10*a*, 10*b*, and 10*c* and the reflection diffusion plate 110 and is spaced a predetermined distance "d" from a lower portion 100*a* of the backlight unit 100. The transmission diffusion plate 140 diffuses and transmits light incident thereon.

If the transmission diffusion plate 140 is too close to the side emitting devices 10*a*, 10*b*, and 10*c*, the side emitting devices 10*a*, 10*b*, and 10*c* appear brighter than the spaces between the side emitting devices, thereby reducing the brightness uniformity. Further, as the transmission diffusion plate 140 is separated from the side emitting devices 10*a*, 10*b*, and 10*c*, the thickness of the backlight unit 100 increases. Accordingly, the distance "d" between the transmission diffusion plate 140 and the lower portion 100*a* of the backlight unit 100 including the side emitting devices 10*a*, 10*b*, and 10*c*, and the reflection diffusion plate 110 can be minimized within a range so that the light can be uniformly mixed by light diffusion and without the need to increase the backlight unit thickness.

Since the backlight unit 100 according to the present embodiment uses the side emitting devices 10*a*, 10*b*, and 10*c* as light sources, the light can be mixed sufficiently even though the distance "d" between the light sources and the transmission diffusion plate 110 over the light sources is reduced, as compared to a general backlight unit that uses a conventional side emitting LED as a light source. Accordingly, the thickness of the backlight unit 100 according to the present embodiment can be less than the thickness required by a conventional backlight unit used with a conventional side emitting LED.

The side emitters 50 redirect obliquely downward most of the light emitted from the light-emitting devices 30 of the side emitting devices 10 and 10*a*, 10*b*, and 10*c*. However, as described above, part of the light may propagate upward from the side emitters 50. For example, the amount of the light propagating upward from the side emitters 50 may correspond to approximately 20% of the total light emitted from the light-emitting devices 30.

Due to the light propagating upward from the side emitters 50, light spots may be visible at the positions of the LED chips 31 when being seen from above the backlight unit 100. Similarly, when the R, G, and B LED chips 31 respectively emitting R, G, and B color light are disposed to realize a color image, colored spots may be visible.

To solve the problems caused by the light propagating upward from the side emitters 50, the backlight unit 100 may further include a plurality of reflective mirrors 120 formed on a surface of an optical plate 130 to reflect the light emitted upward from the side emitting devices 10*a*, 10*b*, and 10*c*. The plurality of the reflective mirrors 120 may be arranged in an array on the surface of the optical plate 130 directly over the side emitting devices 10*a*, 10*b*, and 10*c*.

The optical plate 130 on which the plurality of reflective mirrors 120 are formed may be made of transparent poly-methyl-methacrylate (PMMA), which transmits incident light. The optical plate 130 may also be a transmission diffusion plate.

The plurality of reflective mirrors 120 and the side emitting devices 10*a*, 10*b*, and 10*c* may be spaced at a predetermined distance from each other and supports 135 may be placed between the optical plate 130 and the reflection diffusion plate 110 or the base plate 101 to maintain the distance therebetween.

When the optical plate 130 is a transmission diffusion plate, more light diffusion may occur than when only the reflection diffusion plate 110 and the transmission diffusion plate 140 are used. Accordingly, the distance between the transmission diffusion plate 140 and the side emitting devices 10*a*, 10*b*, and 10*c*, that is, the distance "d" between the transmission diffusion plate 140 and the lower portion 100*a* of the backlight unit 100, can be reduced further, resulting in a reduction in the thickness of the backlight unit 100.

When the optical plate 130 is the transmission diffusion plate, the light transmission is reduced more than when the optical plate 130 is made of the transparent PMMA. Accordingly, if the light transmission is more important than the reduction in thickness, the optical plate 130 can be made of transparent PMMA, and if the reduction in the thickness of the backlight unit 100 is more important than light transmission, the optical plate 130 can be the transmission diffusion plate.

The backlight unit 100 may further include a brightness enhancement film 150 to enhance directionality of the light emitted from the transmission diffusion plate 140, and a polarization enhancement film 170 to enhance polarization efficiency.

The brightness enhancement film 150 refracts and concentrates the light emitted from the transmission diffusion plate 140 to increase light's directionality and brightness.

The polarization enhancement film 170 can transmit selectively light with a certain polarization direction, for example, p-polarized light, and reflect the light with different polarization, for example, s-polarized light. After passing through the polarization enhancement film, most of the incident light is emitted as polarized light, that is, for example, p-polarized light.

When an LCD employs the backlight unit 100 according to the present embodiment, a liquid crystal panel is provided over the backlight unit 100. As is well known to those skilled in the art, when linearly polarized light is incident on a liquid crystal layer of the liquid crystal panel and electric field switching is applied to the liquid crystal layer, image information is displayed as a result of the change in the polarization of the light passing through the liquid crystal layer.

Accordingly, if the light incident on the liquid crystal panel is polarized in one direction, LCD's illumination efficiency can be enhanced. Therefore, if the polarization enhancement film 170 is included in the backlight unit 100, illumination efficiency can be enhanced.

As described above, since the backlight unit 100 of the present general inventive concept uses the array of side emitting devices 10a, 10b, and 10c emitting light obliquely downward, as point light sources, interference with adjacent side emitting devices 10a, 10b, and 10c does not occur. Moreover, since the side emitting devices 10a, 10b, and 10c emit light obliquely downward, the reflection diffusion plate 110 and the transmission diffusion plate 140 can diffuse the light to a wider area. Therefore, light with uniform intensity can be obtained over the entire backlight unit 100.

Accordingly, when the backlight unit 100 according to an embodiment of the present general inventive concept is used to illuminate an LCD, the image displayed has a high quality with uniform brightness.

Figure 4:
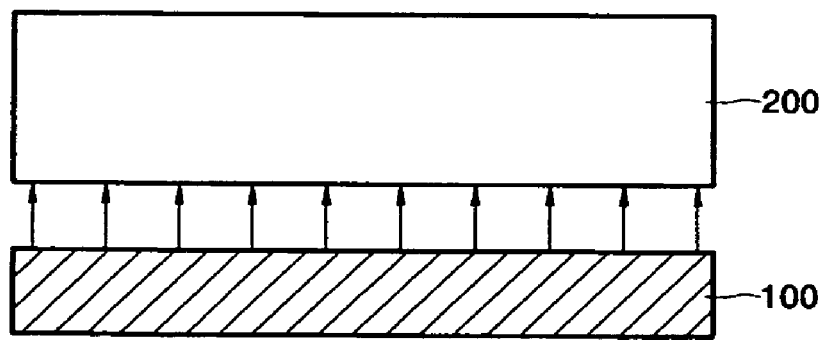
FIG. 4 is a schematic sectional view of a liquid crystal display (LCD) which employs the backlight unit illustrated in FIG. 3 according to another embodiment of the present general inventive concept.

FIG. 4 is a schematic sectional view of an LCD which employs the backlight unit 100 according to an embodiment of the present general inventive concept.

Referring to FIG. 4, the LCD includes the backlight unit 100 and a liquid crystal panel 200 disposed above the backlight unit 100. The liquid crystal panel 200 is connected to a driving circuit unit. Since the structure of the liquid crystal panel 200 and the operation of the driving circuit are well known in the field of LCDs, a detailed explanation thereof will not be given.

The side emitting device according to the present general inventive concept can emit most light downward with respect to the horizontal axis. Accordingly, if the side emitting devices are used as light sources for the backlight unit, the light can be uniformly mixed. In addition, when using the array of side emitting devices of the present general inventive concept interference does not occur.

Consequently, the backlight unit using a plurality of the side emitting devices of the present general inventive concept as point light sources can obtain high quality light with uniform intensity over the entire surface thereof, and the backlight unit can be made thinner. The LCD employing the backlight unit can achieve a high quality image with uniform brightness.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A side emitting device comprising:
a light-emitting device to emit light; and
a side emitter to change a path of at least a part of the light incident from the light-emitting device,
wherein when a main direction of the light emitted from the emitting device is an upward direction, a direction opposite to the upward direction is a downward direction, and an axis perpendicular to the main direction is a horizontal axis, the side emitter comprising:
a first reflecting surface to reflect the light emitted from the light-emitting device in a first range of angles close to a central axis thereof;
a first refracting surface to refract the light reflected by the first reflecting surface obliquely downward with respect to the horizontal axis; and
a second refracting surface to refract the light emitted from the light-emitting device in a second range of angles complementary to the first range of angles.

2. The side emitting device of claim 1, wherein the first reflecting surface is a total-internal-reflection surface that reflects at least a part of the light emitted in the first range of angles by a total internal reflection.

3. The side emitting device of claim 2, wherein the first reflecting surface is a cone-shaped surface centered about the central axis, and is one of a flat shape and a concave shape.

4. The side emitting device of claim 1, wherein the first range of angles ranges from approximately 40° to 140° with respect to the horizontal axis of the light-emitting device.

5. The side emitting device of claim 1, wherein the first refracting surface slants away and downward from the first reflecting surface with respect to an axis parallel to the central axis.

6. The side emitting device of claim 5, wherein the first refracting surface slants away at an angle of approximately 30° to 60° with respect to the axis parallel to the central axis.

7. The side emitting device of claim 1, wherein the second refracting surface refracts at least a part of the incident light obliquely downward from the horizontal axis.

8. The side emitting device of claim 7, wherein the second refracting surface is one of a flat shape and a concave shape.

9. The side emitting device of claim 1, further comprising:
a second reflecting surface to reflect the light refracted by the second refracting surface obliquely downward.

10. The side emitting device of claim 9, wherein the second reflecting surface is in contact with the first refracting surface and the second refracting surface, and is a coated surface to reflect incident light.

11. The side emitting device of claim 1, wherein each of the first refracting surface, the second refracting surface, and the first reflecting surface is symmetric with respect to the central axis.

12. A backlight unit comprising:
an array of the side emitting devices arranged on a base plate, each side emitting device comprising:
a light-emitting device to emit light; and
a side emitter to change a path of at least a part of the light incident from the light-emitting device,
wherein when a main direction of the light emitted from the emitting device is an upward direction, a direction opposite to the upward direction is a downward direction, and an axis perpendicular to the main direction is a horizontal axis, and the side emitter includes:
a first reflecting surface to reflect the light emitted from the light-emitting device in a first range of angles close to a central axis;
a first refracting surface to refract the light reflected by the first reflecting surface obliquely downward with respect to the horizontal axis, and
a second refracting surface to refract the light emitted from the light-emitting device in a second range of angles outside of the first range of angles; a reflection diffusion plate disposed under the side emitting devices, to diffuse and reflect the light incident from the side emitting device; and
a first transmission diffusion plate disposed above the side emitting devices, to diffuse and transmit the incident light.

13. The backlight unit of claim 12, wherein the first reflecting surface of each side emitting device is a totalinternal-reflection surface reflecting at least a part of the light emitted in the first range of angles by a total internal reflection.

14. The backlight unit of claim 13, wherein the first reflecting surface of each side emitting device is a cone-shaped surface centered around the central axis of each side emitting device, and is one of a flat shape and a concave shape.

15. The backlight unit of claim 12, wherein the first range of angles of each side emitting device is from approximately 40° to 140° with respect to the horizontal axis of the light-emitting device.

16. The backlight unit of claim 12, wherein the first refracting surface of each side emitting device slants away from the first reflecting surface of the respective side emitting device with respect to an axis parallel to the central axis of the respective side emitting device.

17. The backlight unit of claim 16, wherein the first refracting surface of each side emitting device slants away at an angle of approximately 30° to 60° with respect to the axis parallel to the central axis of the respective side emitting device.

18. The backlight unit of claim 12, wherein the second refracting surface of each side emitting device refracts at least a part of the incident light obliquely downward from the horizontal axis.

19. The backlight unit of claim 18, wherein the second refracting surface is one of a flat surface and a concave surface.

20. The backlight unit of claim 12, wherein each side emitter of the side emitting devices further comprises:
a second reflecting surface to reflect the light refracted by the second refracting surface obliquely downward.

21. The backlight unit of claim 20, wherein the second reflecting surface of each side emitting device is in contact with the first refracting surface and the second refracting surface, and is a coated surface to reflect the incident light.

22. The backlight unit of claim 12, wherein each of the first refracting surface, the second refracting surface, and the first reflecting surface of the side emitting device is symmetric with respect to the central axis thereof.

23. The backlight unit of claim 12, wherein each of the side emitting devices emits one of red, green, and blue light, or emits white light.

24. The backlight unit of claim 12, further comprising:
an optical plate disposed above the plurality of the side emitting devices; and
a plurality of reflective mirrors formed on one surface of the optical plate to reflect light that passes through the side emitting devices and propagates upwardly.

25. The backlight unit of claim 24, wherein the optical plate is one of a plate made of a transparent polymethylmethacrylate (PMMA) and a second transmission diffusion plate.

26. The backlight unit of claim 12, further comprising at least one of a brightness enhancement film to enhance directionality of the light emitted from the first transmission diffusion plate and a polarization enhancement film to enhance polarization efficiency.

27. A liquid crystal display comprising:
a liquid crystal panel; and
the backlight unit to emit light to the liquid crystal panel, the backlight unit comprising:
an array of the side emitting devices arranged on a base plate, and each side emitting device includes:
a light-emitting device to emit light, and
a side emitter to change a path of at least a part of the light incident from the light-emitting device,
wherein when a main direction of the light emitted from the emitting device is an upward direction, a direction opposite to the upward direction is a downward direction, and an axis perpendicular to the main direction is a horizontal axis, and the side emitter includes a first reflecting surface to reflect the light emitted from the light-emitting device in a first range of angles close to a central axis, a first refracting surface to refract the light reflected by the first reflecting surface obliquely downward with respect to the horizontal axis, and a second refracting surface to refract the light emitted from the light-emitting device in a second range of angles outside of the first range of angles,
a reflection diffusion plate disposed under the side emitting devices, to diffuse and reflect the light incident from the side emitting device, and
a first transmission diffusion plate disposed over the side emitting device, to diffuse and transmit incident light.

28. The liquid crystal display of claim 27, wherein the first reflecting surface of each side emitting device is a total-internal-reflection surface that reflects at least part of the light emitted in the first range of angles by a total internal reflection.

29. The liquid crystal display of claim 28, wherein the first reflecting surface of each side emitting device is a cone-shaped surface centered about the central axis of the respective side emitting device, and is one of a flat surface and a concave surface.

30. The liquid crystal display of claim 27, wherein the first range of angles of each side emitting device ranges from approximately 40° to 140° with respect to the horizontal axis.

31. The liquid crystal display of claim 27, wherein the first refracting surface of each side emitting device slants away from the first reflecting surface of the respective side emitting device with respect to an axis parallel to the central axis of the respective side emitting device.

32. The liquid crystal display of claim 31, wherein first refracting surface of each side emitting device slants away at an angle of approximately 30° to 60° with respect to the axis parallel to the central axis of the respective side emitting device.

33. The liquid crystal display of claim 27, wherein the second refracting surface of each side emitting device refracts at least part of the incident light obliquely downward from the horizontal axis.

34. The liquid crystal display of claim 33, wherein the second refracting surface of each side emitting device is one of a flat surface and a concave surface.

35. The liquid crystal display of claim 27, each side emitter of the side emitting devices further comprises:
a second reflecting surface of the respective side emitting device to reflect the light refracted by the second refracting surface of the respective side emitting device obliquely downward.

36. The liquid crystal display of claim 35, wherein the second reflecting surface of each side emitting device is in contact with the first refracting surface of the respective side emitting device and second refracting surface of the respective side emitting device, and is a coated surface to reflect the incident light.

37. The liquid crystal display of claim 27, wherein each of the first refracting surface of each side emitting device, the second refracting surface of each side emitting device, and the first reflecting surface of each side emitting device is symmetric with respect to the central axis of the respective side emitting device.

38. The liquid crystal display of claim 27, wherein each of the side emitting devices emits one of red, green, and blue light or emits white light, so that a color image is displayed.

39. The liquid crystal display of claim 27, wherein the backlight unit further comprises:
an optical plate disposed above the plurality of side emitting devices; and
a plurality of reflective mirrors formed on one surface of the optical plate to reflect light that passes through the side emitting devices and then propagates upwardly.

40. The liquid crystal display of claim 39, wherein the optical plate is one of a plate made of a transparent PMMA and a second transmission diffusion plate.

41. The liquid crystal display of claim 27, further comprising at least one of a brightness enhancement film to enhance directionality of the light emitted from the first transmission diffusion plate and a polarization enhancement film to enhance polarization efficiency.

42. An illumination controlling apparatus comprising:
a base portion that contacts a light-emitting device to receive the emitted light therefrom;
a first cone-shaped reflecting surface to reflect the light received within a first range of angles with respect to a central axis thereof;
a first refracting surface to refract the light reflected by the first reflecting surface obliquely and back toward the light emitting device; and
a second refracting surface to refract the light received within a second range of angles complementary to the first range of angles with respect to a central axis thereof.

43. The illumination controlling apparatus of claim 42, wherein each of the cone-shaped first reflecting surface, first refracting surface and second refracting surface share the same central axis.

44. The illumination controlling apparatus of claim 42, wherein the first reflecting surface is a total-internal-reflection surface that reflects at least a part of the light emitted in the first range of angles by total internal reflection.

45. The illumination controlling apparatus of claim 42, further comprising:
a second reflecting surface to reflect the light refracted by the second refracting surface obliquely and back toward the light emitting device.

46. A method of redirecting light emitted by a Lambertian light source mounted on a base surface, wherein when a central axis is perpendicular to the base surface passing through the Lambertian light source, and an axis perpendicular to the central axis passing through the Lambertian light source is a horizontal axis, the method comprising:
changing a path of at least a part of the light from the Lambertian light source emitted in a first range of angles close to the central axis;
refracting the light with changed path obliquely with respect to the horizontal axis towards the Lambertian light source; and
refracting a first portion of the light from the Lambertian light source emitted in a second range of angles complementary to the first range of angles obliquely with respect to the horizontal axis towards the Lambertian light source.

47. The method of claim 46, further comprising:
reflecting back towards the Lambertian light source a second portion of the light from the Lambertian light source emitted in the second range of angles, light that was refracted obliquely with respect to the horizontal axis away from the Lambertian light source.

48. The side emitting device of claim 1, further comprising:
a second reflecting surface disposed externally on the side emitting device to diffuse and reflect external light.

49. The side emitting device of claim 1, further comprising:
an external reflective surface to diffuse and reflect external light.

50. The backlight unit of claim 12, further comprising:
a second reflecting surface to reflect light refracted by the second refracting surface.

51. The backlight unit of claim 12, further comprising:
a second reflecting surface of each side emitting device to reflect light only obliquely downward from the horizontal axis.

52. The backlight unit of claim 12, wherein the side emitter emits light only obliquely downward from the horizontal axis.

* * * * *